US009276004B2

(12) United States Patent
Xia

(10) Patent No.: US 9,276,004 B2
(45) Date of Patent: Mar. 1, 2016

(54) ROM ARRAYS HAVING MEMORY CELL TRANSISTORS PROGRAMMED USING METAL GATES

(75) Inventor: Wei Xia, Irvine, CA (US)

(73) Assignee: BROADCOM CORPORATION, Irvine, CA (US)

(*) Notice: Subject to any disclaimer, the term of this patent is extended or adjusted under 35 U.S.C. 154(b) by 0 days.

(21) Appl. No.: 13/436,621

(22) Filed: Mar. 30, 2012

(65) Prior Publication Data
US 2013/0256804 A1 Oct. 3, 2013

(51) Int. Cl.
H01L 21/70 (2006.01)
H01L 27/112 (2006.01)
H01L 21/28 (2006.01)
H01L 29/49 (2006.01)
H01L 29/51 (2006.01)
H01L 29/66 (2006.01)

(52) U.S. Cl.
CPC .... *H01L 27/11233* (2013.01); *H01L 27/11293* (2013.01); *H01L 29/66545* (2013.01); *H01L 21/28079* (2013.01); *H01L 21/28088* (2013.01); *H01L 29/4958* (2013.01); *H01L 29/4966* (2013.01); *H01L 29/517* (2013.01); *H01L 29/665* (2013.01)

(58) Field of Classification Search
CPC ................................. H01L 21/28079
USPC ............................................. 257/368
See application file for complete search history.

(56) References Cited

U.S. PATENT DOCUMENTS 6,417,548 B1 * 7/2002 Sheu et al. ............. 257/391
8,119,473 B2   2/2012 Huang et al.

8,384,160 B2       2/2013  Onishi et al.
2004/0178432 A1 *  9/2004  Eppich et al. ............. 257/296
2008/0149984 A1 *  6/2008  Chang et al. .............. 257/314
2009/0087974 A1 *  4/2009  Waite et al. ............... 438/592
2010/0164007 A1 *  7/2010  Onishi et al. .............. 257/369
2011/0198699 A1 *  8/2011  Hung et al. ............... 257/369

(Continued)

FOREIGN PATENT DOCUMENTS

CN   101771048 A   7/2010
CN   102117745 A   7/2011

(Continued)

OTHER PUBLICATIONS

Taiwanese Office Action issued Dec. 3, 2014, in Taiwanese Application No. 101138245 (7 pages).
Chinese Office Action issued Jun. 2, 2015, in CN201210366066.3 (No English translation).

*Primary Examiner* — Karen Kusumakar
(74) *Attorney, Agent, or Firm* — Oblon, McClelland, Maier & Neustadt, L.L.P.

(57) ABSTRACT

According to one exemplary implementation, an integrated circuit (IC) includes a first memory cell transistor of a read only memory (ROM) array, the first memory cell transistor including a first metal gate of a first work function and having a first threshold voltage. The IC also includes a second memory cell transistor of the ROM array, the second memory cell transistor including a second metal gate of a second work function and having a second threshold voltage. The first memory cell transistor and the second memory cell transistor can be of a first conductivity type. Furthermore, the first memory cell transistor can include a first high-k gate dielectric and the second memory cell transistor can include a second high-k gate dielectric.

21 Claims, 9 Drawing Sheets

(56) References Cited

U.S. PATENT DOCUMENTS

2012/0086075 A1* 4/2012 Huang et al. .................. 257/334
2013/0049119 A1* 2/2013 Huang et al. .................. 257/351

FOREIGN PATENT DOCUMENTS

TW 344137 11/1998
TW 201025569 A1 7/2010

* cited by examiner

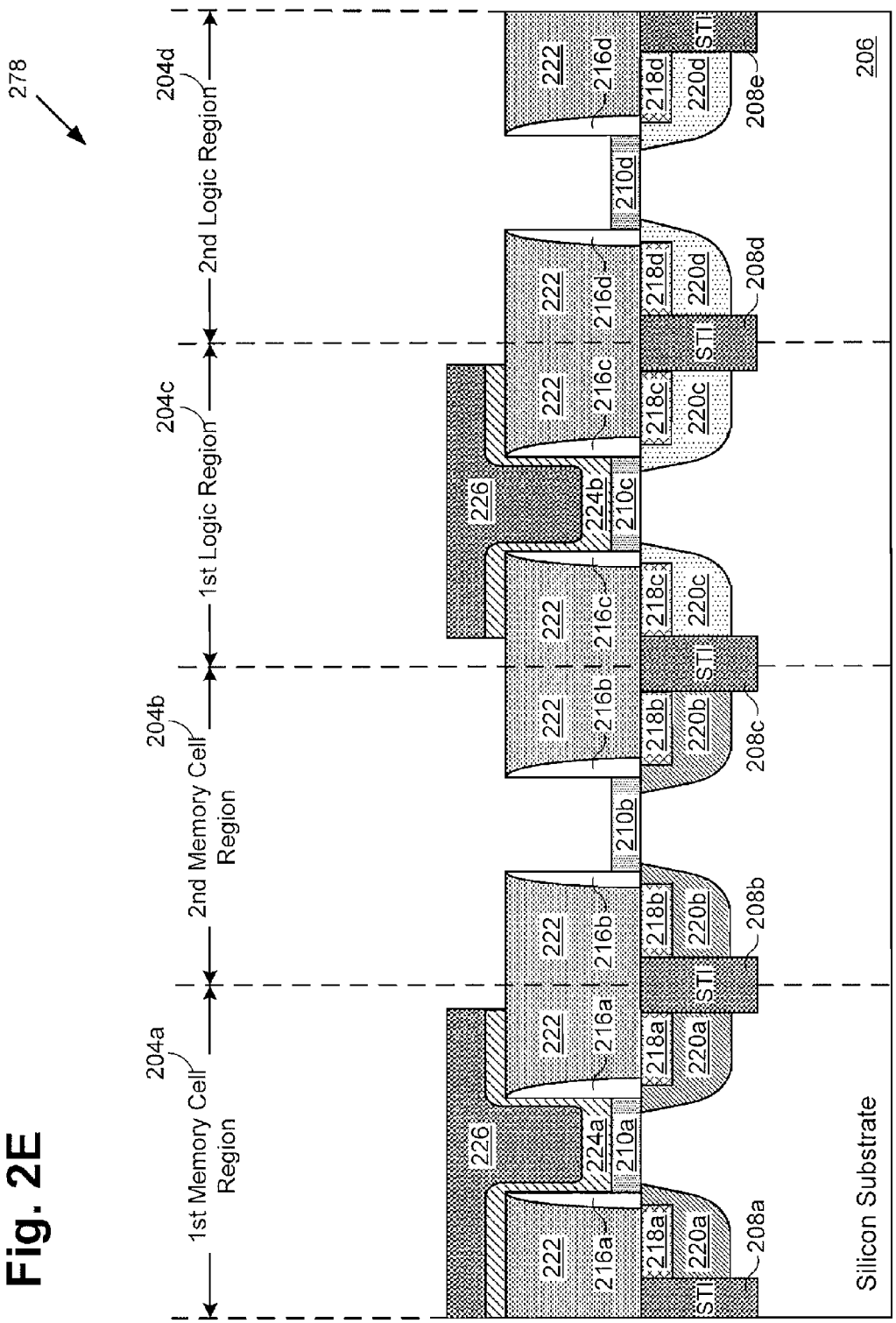

ROM ARRAYS HAVING MEMORY CELL TRANSISTORS PROGRAMMED USING METAL GATES

BACKGROUND

Read-only memory (ROM) is often utilized to store data, such as firmware data, on an integrated circuit (IC). ROM is typically structured as an array of memory cell transistors, and is usually programmed with data during manufacture. By programming the array such that some memory cell transistors are distinguishable from others by sensing circuitry on the IC, logical states corresponding to binary data are stored on the ROM.

Various techniques are known for ROM programming. One approach is to utilize a high-grade interconnect mask to block contact to some of the memory cell transistors. Another approach is to use a channel implant to alter a threshold voltage of some of the memory cell transistors, providing a detectable threshold voltage difference. In yet another approach, gate oxides of different thickness may provide different threshold voltages for the memory cell transistors.

SUMMARY

The present disclosure is directed to ROM arrays having memory cell transistors programmed using metal gates, substantially as shown in and/or described in connection with at least one of the figures, and as set forth more completely in the claims.

BRIEF DESCRIPTION OF THE DRAWINGS

FIG. 2E illustrates a cross-sectional view of a potion of an exemplary IC during processing.

DETAILED DESCRIPTION

Figure 1:
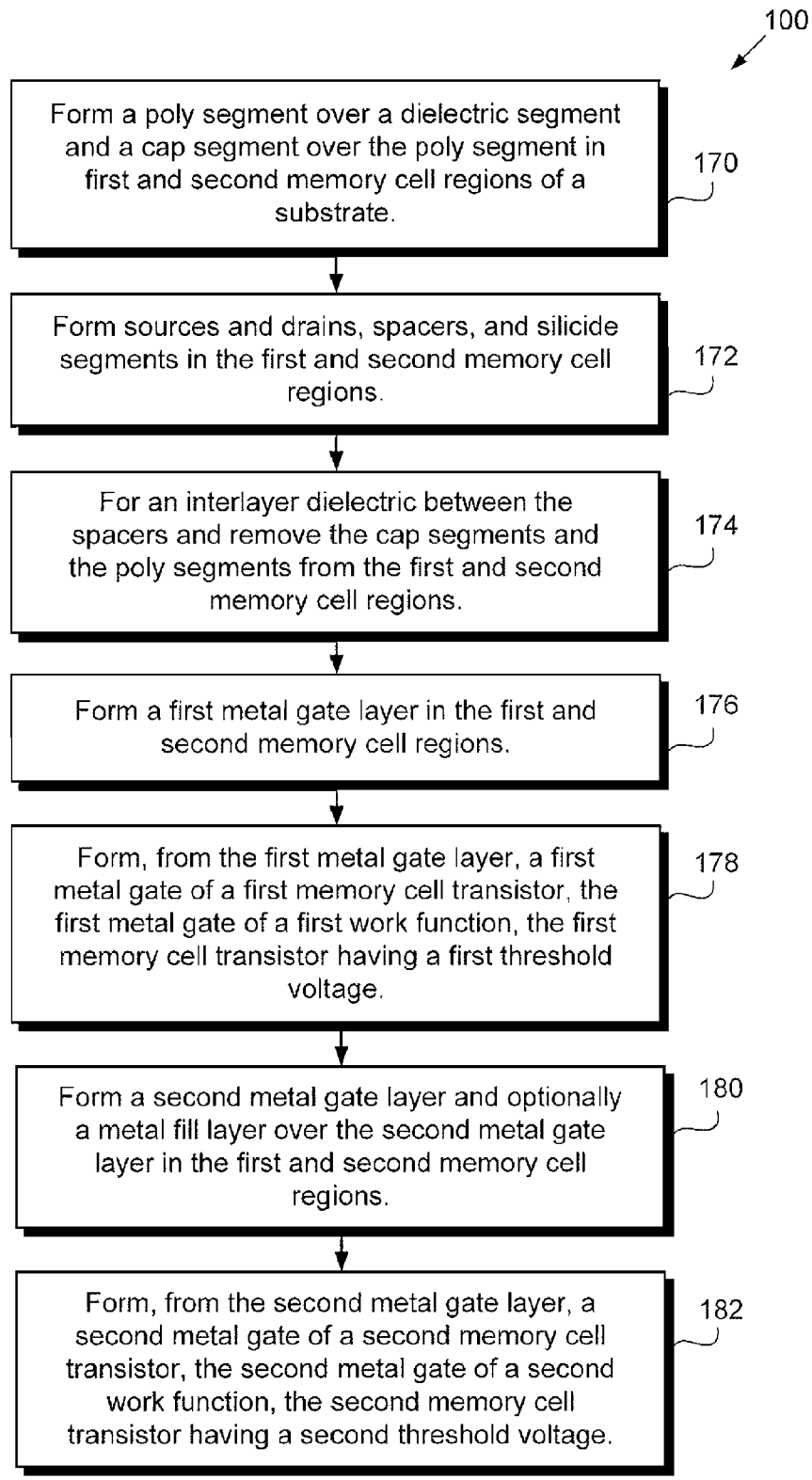
FIG. 1 shows a process flow diagram illustrating an exemplary process for fabricating an integrated circuit (IC).

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a process flow diagram illustrating an exemplary process for fabricating an integrated circuit (IC). More particularly, FIG. 1 shows a process flow diagram illustrating a process 100 for fabricating an integrated circuit (IC). While applicable for fabricating various ICs shown and described in this disclosure, for illustrative purposes, the process 100 is described with respect to the structures shown in FIGS. 2A, 2B, 2C, 2D, 2E, 2F, and 2G and the IC shown in FIG. 3.

The implementation illustrated by the process 100 can be performed on a processed wafer, which includes, among other things, a substrate, such as a silicon substrate, conductive wells (P type or N type) for channel regions in the substrate, and isolation regions, such as shallow trench isolation (STI) regions. The wafer may also be referred to as a semiconductor die or simply a die.

Figure 2A:
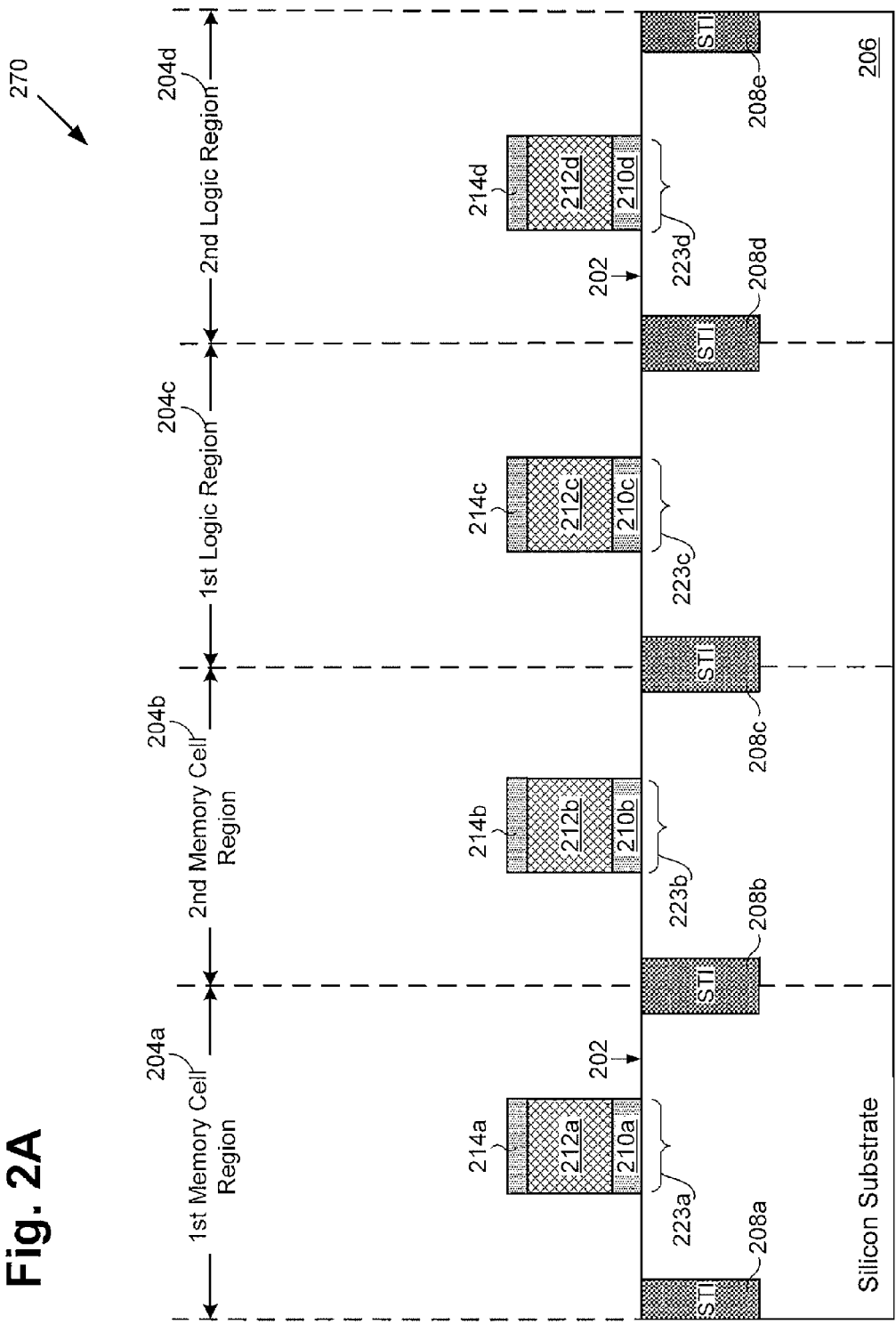
FIG. 2A illustrates a cross-sectional view of a potion of an exemplary IC during processing.

Referring now to FIG. 1 and FIG. 2A, the process 100 includes forming a poly segment (e.g., 212a, 212b) over a dielectric segment (e.g., 210a, 210b) and a cap segment (e.g., 214a, 214b) over the poly segment in first (e.g., 204a) and second (e.g., 204b) memory cell regions of a substrate (e.g., 206) (170). A structure 270 includes a memory cell region 204a and a memory cell region 204b (also referred to as "memory cell regions 204") of a substrate 206. The structure 270 also includes a logic region 204c and a logic region 204d (also referred to as "logic regions 204") of the substrate 206. The memory cell regions 204 and the logic regions 204 are also referred to collectively as substrate regions 204.

In the present implementation, the substrate 206 is a semiconductor substrate, and more particularly, a silicon substrate. However, the substrate 206 can include other materials in addition to or instead of silicon. The substrate 206 includes isolation regions 208a, 208b, 208c, 208d, and 208e (also referred to as "isolation regions 208"), which can be shallow trench isolation (STI) regions or other types of isolation regions. The isolation regions 208 can include silicon oxide or other dielectric material. Various ones of the isolation regions 208 are shown as being in more than one of the memory cell regions 204 and/or the logic regions 204 for simplicity. However, specific depicted locations of the isolation regions 208 are not intended to be limiting.

The memory cell regions 204 are designated for memory cell transistor formation in the substrate 206. Similarly, the logic regions 204 are designated for logic transistor formation in the substrate 206. However, in various implementations, any combination of the substrate regions 204 can be designated for memory cell transistor formation or logic transistor formation. For example, all of the substrate regions 204 may be designated for memory cell transistor formation, or all of the substrate regions 204 may be designated for logic transistor formation. Furthermore, aspects of the present disclosure are not limited to memory cell transistor formation and logic transistor formation.

The substrate regions 204 respectively include dielectric segments 210a, 210b, 210c, and 210d (also referred to as "dielectric segments 210"), poly segments 212a, 212b, 212c, and 212d (also referred to as "poly segments 212"), and cap segments 214a, 214b, 214c, and 214d (also referred to as "cap segments 214"). The structure 270 corresponds to an exemplary implementation after forming the poly segments 212 over the dielectric segments 210 and the cap segments 214 over the poly segments 212 in the substrate regions 204. The poly segments 212 are formed respectively over the dielectric segments 210 and the cap segments 214 are formed respectively over the poly segments 212 in the memory cell regions 204a and 204b. Similarly, the poly segments 212 are formed respectively over the dielectric segments 210 and the cap segments 214 are formed respectively over the poly segments 212 in the logic regions 204c and 204d.

The dielectric segments 210 include high-k dielectric material. Suitable materials for the dielectric segments 210 include, as specific examples, hafnium oxide ($HfO_2$), zirconium oxide ($ZrO_2$), chromium oxide ($CrO_2$), and the like. However, in some implementations, the dielectric segments 210 include silicon oxide, silicon nitride, and/or other types of dielectric materials instead of or in addition to high-k dielectric material. While in some implementations the dielectric segments 210 include substantially similar materials, in other implementations the dielectric segments 210 include different materials with respect to one another. Similarly, the poly segments 212 and the cap segments 214 may have different materials with respect to one another.

In one implementation, forming the dielectric segments 210, the poly segments 212, and the cap segments 214 includes sequentially forming a dielectric layer, a poly layer, and a cap layer on the substrate 206. The dielectric layer and the cap layer can be formed respectively by depositing dielectric material over the substrate 206 utilizing physical vapor deposition (PVD), chemical vapor deposition (CVD), or another deposition technique. The poly layer can be formed by depositing a layer of polysilicon over the substrate 206 utilizing PVD, CVD, or another deposition technique.

Subsequently, the dielectric layer, the poly layer, and the cap layer can be patterned to form the dielectric segments 210, the poly segments 212, and the cap segments 214. The patterning, which can include masking and etching, may expose a top surface 202 of the substrate 206. As will become apparent from subsequent Figures, the patterning can also define gate lengths 223a, 223b, 223c, and 223d for memory cell transistors and logic transistors to be formed in the substrate regions 204. In the present implementation, the gate lengths 223a, 223b, 223c, and 223d are less than or equal to approximately 20 nm.

Figure 2B:
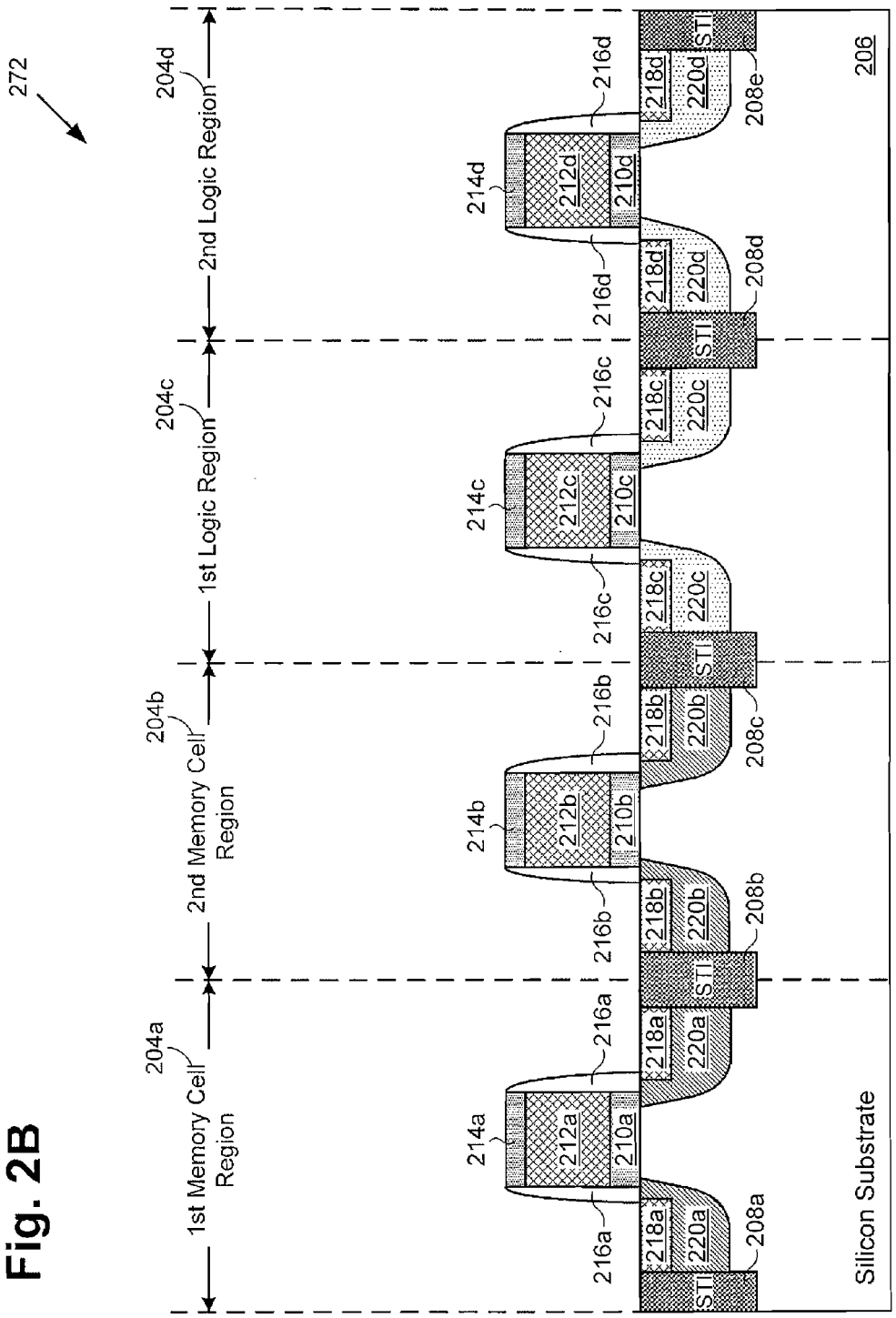
FIG. 2B illustrates a cross-sectional view of a potion of an exemplary IC during processing.

Referring now to FIG. 1 and FIG. 2B, the process 100 includes forming sources (e.g., 220a, 220b), drains (e.g., 220a, 220b), spacers (e.g., 216a, 216b), and silicide segments (e.g., 218a, 218h) in first (e.g., 204a) and second (e.g., 204b) memory cell regions (172). As shown in FIG. 2B, a structure 272 includes spacers 216a, 216b, 216c, and 216d (also referred to as "spacers 216"), silicide segments 218a, 218b, 218c, and 218d (also referred to as "silicide segments 218"), and source/drain regions 220a, 220b, 220c, and 220d (also referred to as "source/drains 220"). The structure 272 corresponds to an exemplary implementation after forming sources/drains 220, the spacers 216, and the silicide segments 218 in the substrate regions 204.

The spacers 216 are formed adjacent to and respectively surround the dielectric segments 210, the poly segments 212, and the cap segments 214. The spacers 216 can include silicon oxide and/or other dielectric material. The spacers 216 can be formed by conformally depositing a layer of dielectric material, such as silicon oxide, over the substrate 206 and the cap segments 214 of the structure 270. The deposition can be accomplished utilizing CVD or another type of deposition and appropriately performing an etch-back of the layer of dielectric material.

The source/drain regions 220 are formed in the substrate 206 adjacent to and respectively under the dielectric segments 210. The source/drain regions 220 can be formed by implanting dopants into the substrate 206 and performing an implant anneal to diffuse the dopants in the substrate 206. Each of the source/drain regions 220 can be formed utilizing the same or different dopant types and/or concentrations. For example, any combination of the source/drain regions 220 can be P type or N type. In the implementation shown, the source/drain regions 220a and 220b are of a first conductivity type, or N type, and the source/drain regions 220c and 220d are of a second conductivity type, or P type. In some implementations, the source/drain regions 220a and 220b may be formed utilizing a same implant and anneal and may have a substantially same doping profile. Similarly, the source/drain regions 220c and 220d may be formed utilizing a same implant and anneal and may have a substantially same doping profile.

The silicide segments 218 are formed respectively on the source/drain regions 220 and are respectively adjacent to the dielectric segments 210. The silicide segments 218 can include metal silicide such as copper silicide, nickel silicide, nickel-platinum silicide or cobalt silicide. In the present implementation, the cap segments 214 prevent silicidation of the poly segments 212 during formation of the silicide segments 218.

Figure 2C:
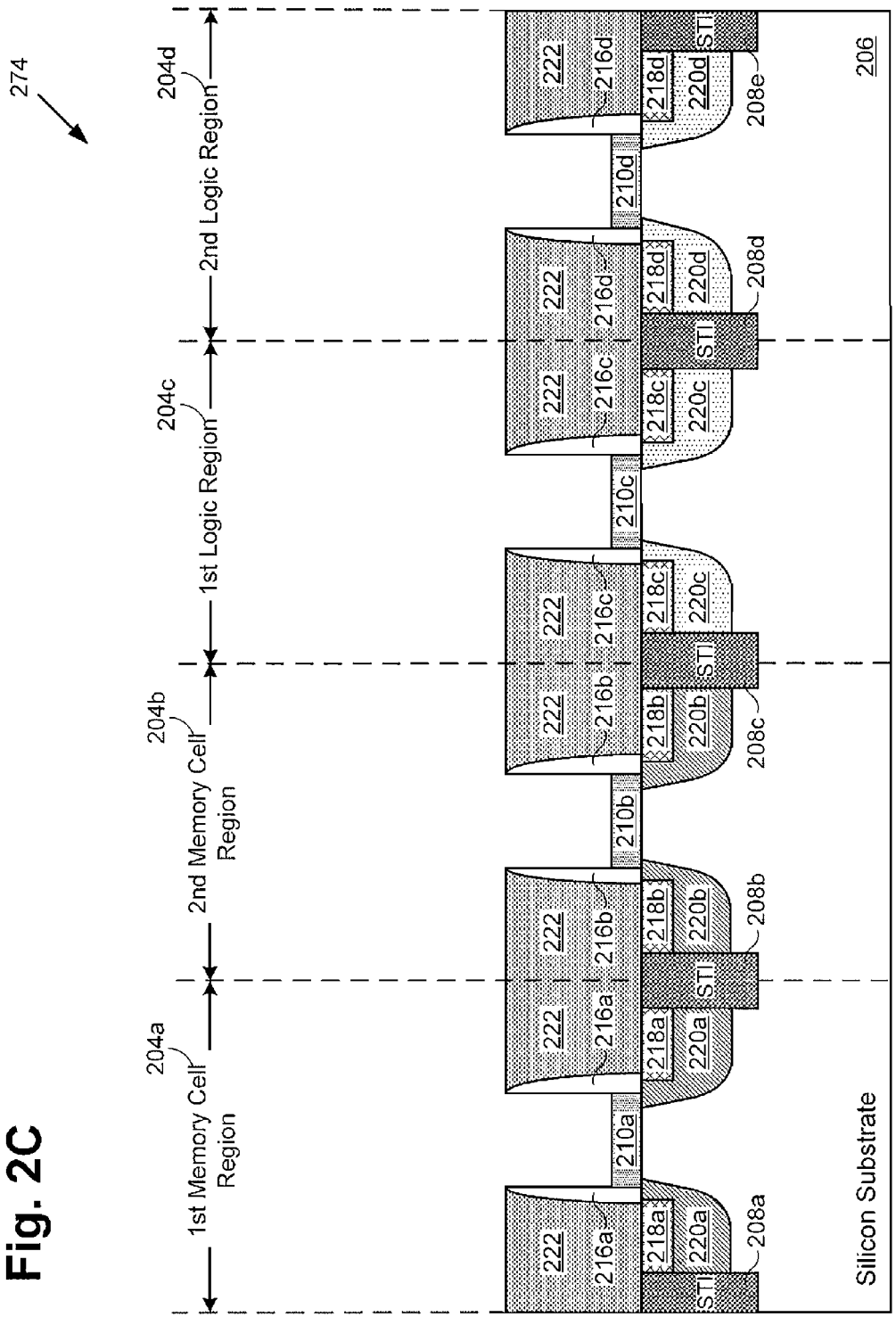
FIG. 2C illustrates a cross-sectional view of a potion of an exemplary IC during processing.

Referring now to FIG. 1 and FIG. 2C, the process 100 includes forming an interlayer dielectric (e.g., 222) between the spacers (e.g., 216a, 216b) and removing the cap segments (e.g., 214a, 214b) and the poly segments (e.g., 212a, 212b) from the first (e.g., 204a) and second (e.g., 204b) memory cell regions (174). In FIG. 2C, a structure 274 corresponds to an exemplary implementation after forming an interlayer dielectric 222 between the spacers 216 and removing the cap segments 214 and the poly segments 212 from the substrate regions 204.

As shown in FIG. 2C, the interlayer dielectric 222 is formed on and surrounds the spacers 216. The interlayer dielectric 222 includes dielectric material, and in the present implementation, is a nitride. In other implementations, the interlayer dielectric 222 can include an oxide or other dielectric material. The interlayer dielectric 222 can be formed by depositing dielectric material over the substrate 206 and the cap segments 214 of the structure 272. The deposition can utilize PVD, CVD, or another deposition technique. The deposited dielectric material can then be planarized utilizing chemical mechanical planarization (CMP) or another planarization technique.

After forming the interlayer dielectric 222, the cap segments 214 can be removed, for example utilizing a selective etch, such as an oxide selective etch, or another type of etch to expose the poly segments 212. Utilizing a selective etch, the cap segments 214 can be removed without removing the interlayer dielectric 222 (e.g. where the interlayer dielectric 222 is a nitride and the cap segments 214 are oxide). The poly segments 212 can also be removed, for example utilizing a selective etch, or another type of etch to expose the dielectric segments 210.

A selective etch may remove the poly segments 212 without removing the dielectric segments 210. This can be useful in implementations where it is desirable to have a controlled thickness of the dielectric segments 210. One such implementation is where the dielectric segments 210 are subsequently included in gate dielectrics of memory cell and/or logic transistors in the substrate regions 204. For example, in the present implementation, the dielectric segments 210 remain in the substrate regions 204 and are utilized as gate dielectrics for memory cell and logic transistors to be formed in the substrate regions 204. However, at least one of the dielectric segments 210 can be removed in other implementations, which may include utilizing a selective etch. Subsequently, one or more other dielectric materials can optionally be deposited and utilized for gate dielectrics of memory cell and/or logic transistors to be formed in the substrate regions 204.

Figure 2D:
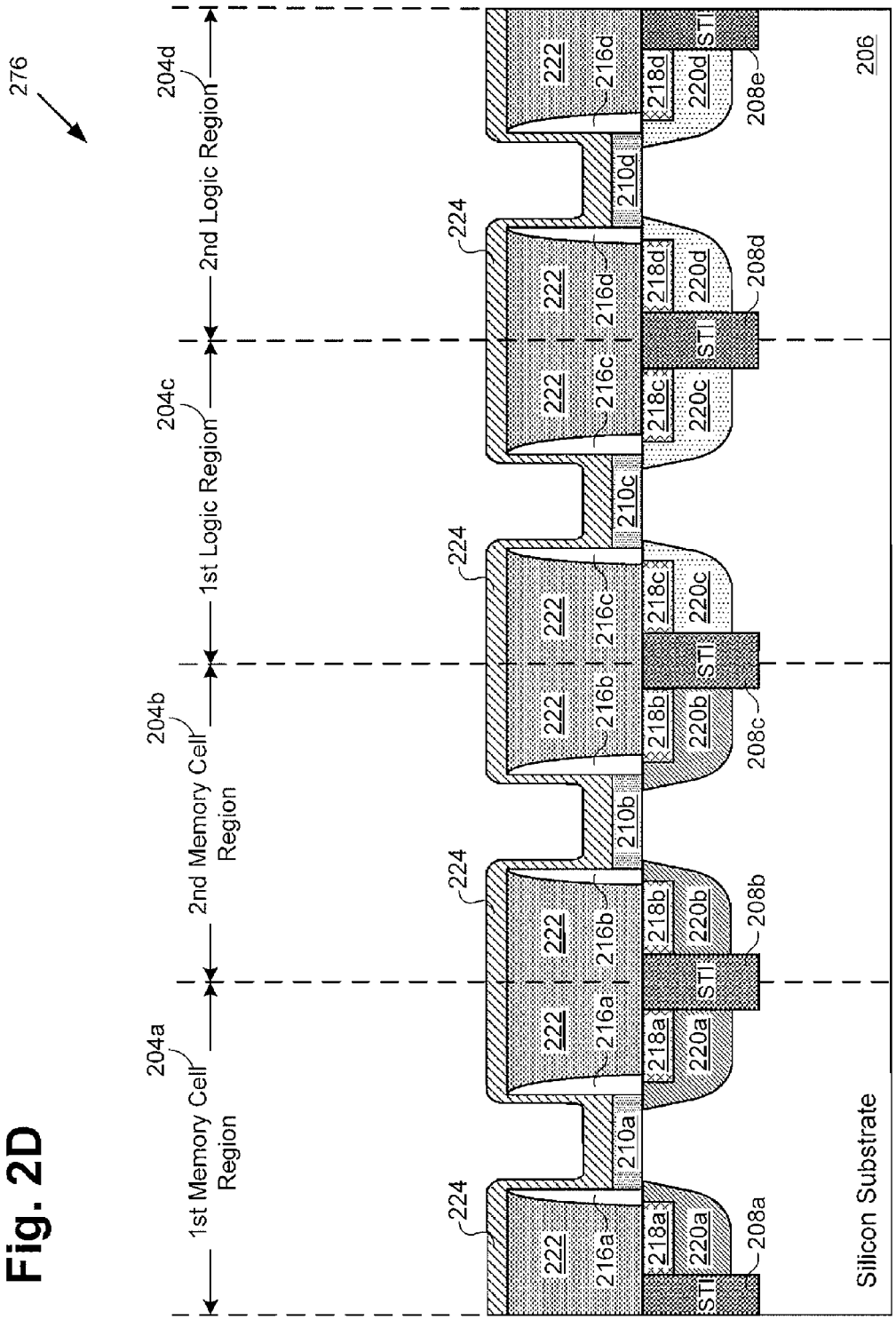
FIG. 2D illustrates a cross-sectional view of a potion of an exemplary IC during processing.

Referring now to FIG. 1 and FIG. 2D, the process 100 includes forming a first metal gate layer (e.g., 224) in the first (e.g., 204a) and second (e.g., 204b) memory cell regions (176). In FIG. 2D, a structure 276 corresponds to an exemplary implementation after forming a metal gate layer 224 in the substrate regions 204.

In the present implementation, the metal gate layer 224 includes metal for a gate of a high-k metal gate transistor, such as an N type high-k metal gate transistor. Suitable materials for an N type high-k metal gate transistor include, as specific examples, tantalum (Ta), tantalum nitride (TaN), titanium nitride (TiN), or other metal or metal stack. In other implementations, the metal gate layer 224 includes metal for a gate of a P type high-k metal gate transistor, or other types of transistors including non-high-k metal gate transistors. The metal gate layer 224 can be formed by depositing a layer of metal over the dielectric segments 210 of the structure 274. The deposition can utilize PVD, CVD, or another deposition technique.

Referring now to FIG. 1 and FIG. 2E, the process 100 includes forming, from the first metal gate layer (e.g., 224), a first metal gate (e.g., 224a) of a first memory cell transistor (e.g., 234a), the first metal gate of a first work function (e.g., $f_1$), the first memory cell transistor having a first threshold voltage (e.g., $Vt_1$) (178). In FIG. 2E, a structure 278 corresponds to an exemplary implementation after forming, from the metal gate layer 224, a metal gate 224a of a memory cell transistor 234a in FIG. 2G. The metal gate 224a is of a work function $f_1$ and the memory cell transistor 234a has a threshold voltage $Vt_1$.

Figure 2F:
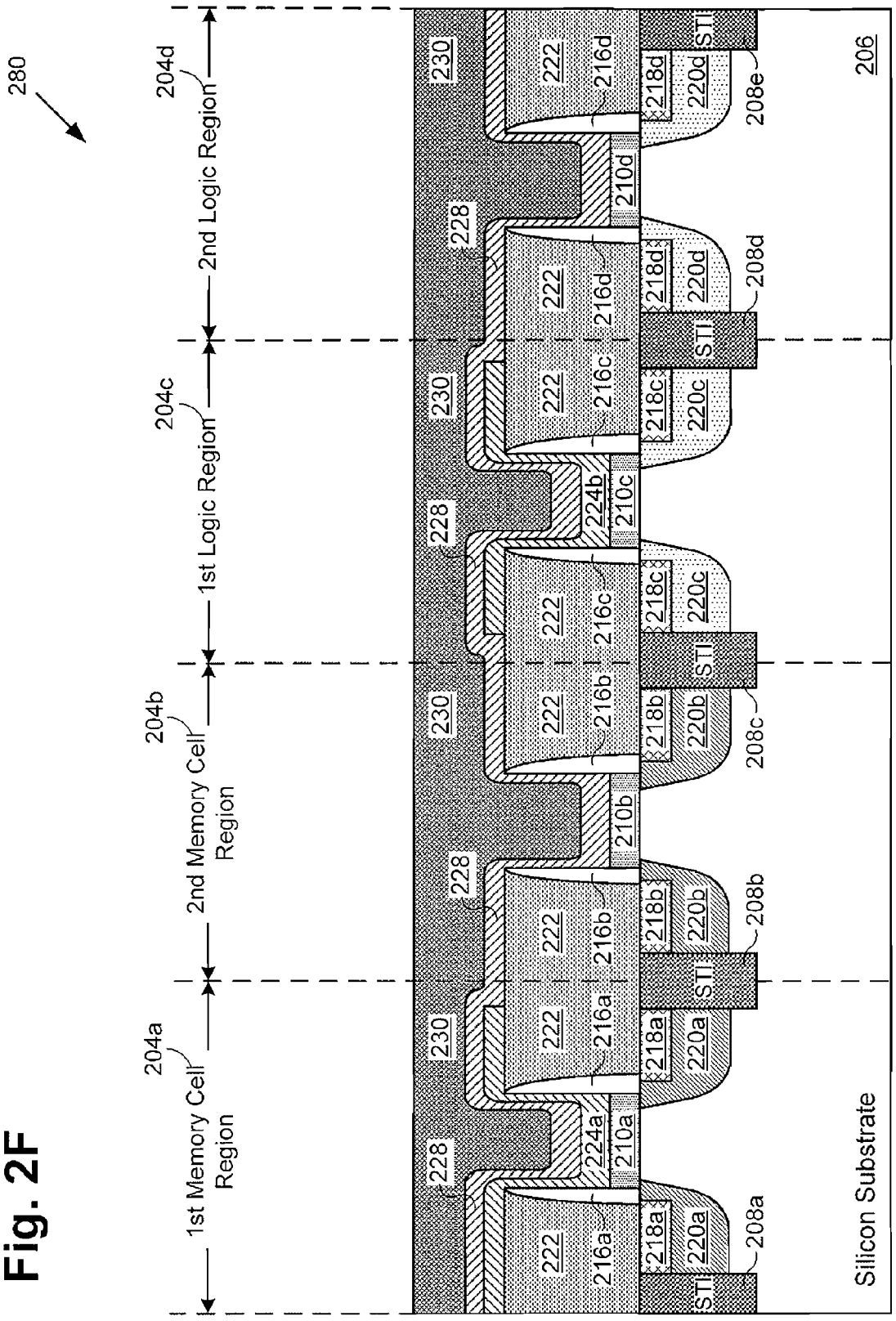
FIG. 2F illustrates a cross-sectional view of a potion of an exemplary IC during processing.
Figure 2G:
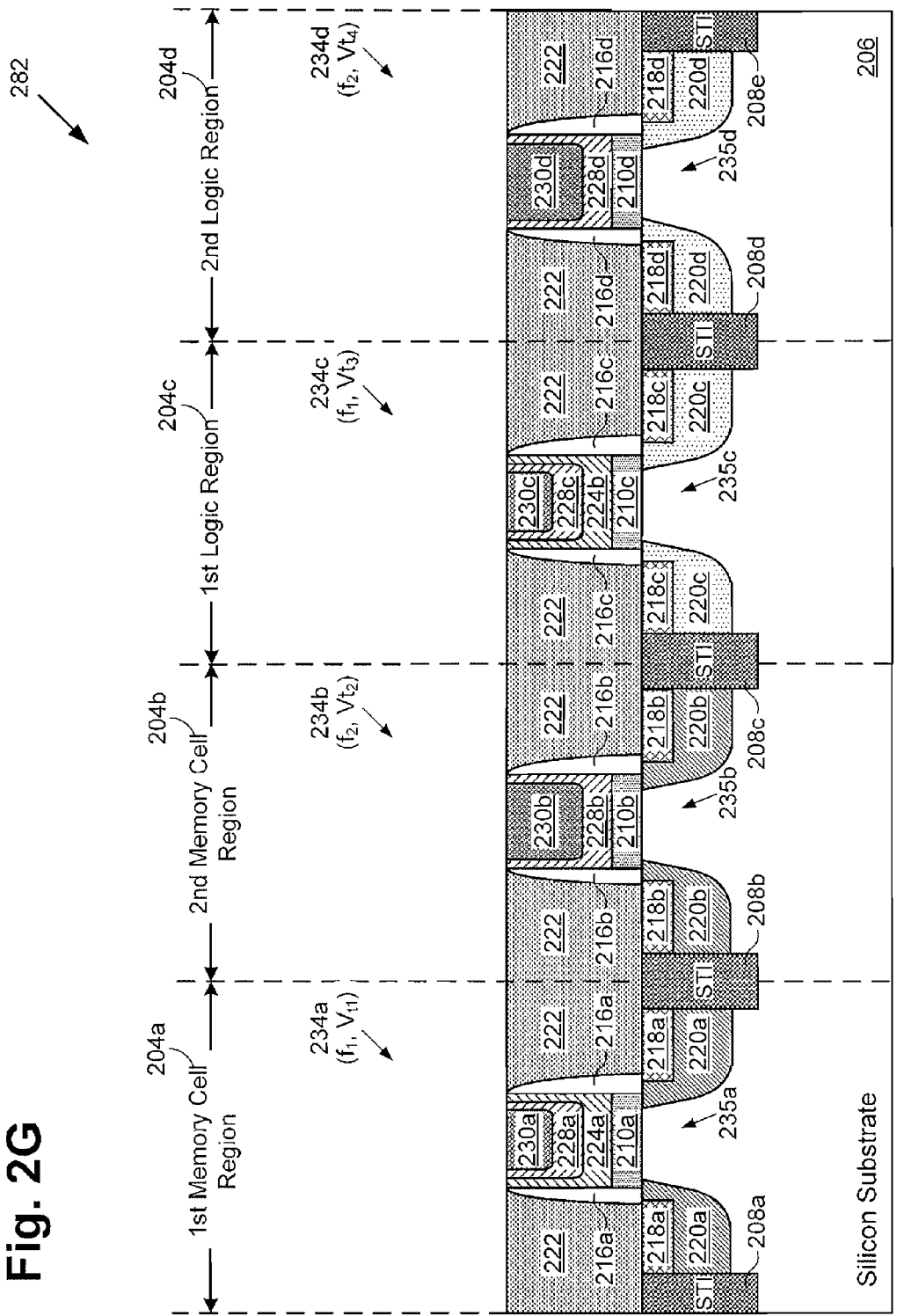
FIG. 2G illustrates a cross-sectional view of a potion of an exemplary IC during processing.

Also, the present implementation includes optionally forming, from the metal gate layer 224, a metal gate 224b of a logic transistor 234c in FIG. 2G. The metal gate 224b is of the work function $f_1$ and the logic transistor 234c has a threshold voltage $Vt_3$. The memory cell transistor 234a is of a first conductivity type and the logic transistor 234c is of a second conductivity type. Thus, the metal gates 224a and 224b can both be formed from the metal gate layer 224 while the logic transistor 234c has the threshold voltage $Vt_3$, which is different than the threshold voltage $Vt_1$ of the memory cell transistor 234a.

The metal gates 224a and 224b can be formed by masking and etching the metal gate layer 224. A mask 226, shown in FIG. 2E, is formed over the structure 276 in FIG. 2D and the metal gate layer 224 is etched to form the metal gates 224a and 224b. The mask 226 covers at least a portion of the metal gate layer 224 over the dielectric segments 210a and 210c and exposes the metal gate layer 224 over the dielectric segments 210b and 210d. Thus, the exposed portions of the metal gate layer 224 over the dielectric segments 210b and 210d are removed during etching. As an example, the metal gates 224a and 224b can be approximately 10 nm to approximately 30 nm thick.

Referring now to FIG. 1 and FIG. 2F, the process 100 includes forming a second metal gate layer (e.g., 228) and optionally a metal fill layer (e.g., 230) over the second gate layer in the first (e.g., 204a) and second (e.g., 204b) memory cell regions (180). In FIG. 2F, a structure 280 corresponds to an implementation after forming a metal gate layer 228, and forming a metal fill layer 230 over the metal gate layer 228 in the substrate regions 204.

In some implementations, the metal gate layer 228 includes metal for a gate of a high-k metal gate transistor, such as a P type high-k metal gate transistor. Suitable materials for the P type high-k metal gate transistor include, as specific examples, molybdenum (Mo), ruthenium (Ru), tantalum carbide nitride (TaCN), or other metal or metal stack. In other implementations, the metal gate layer 228 includes metal for a gate of a N type high-k metal gate transistor, or other types of transistors including non-high-k metal gate transistors. The metal gate layer 228 can be formed by depositing a layer of metal over the dielectric segments 210 of FIG. 2E. The layer of metal can be deposited utilizing PVD, CVD, or another deposition technique.

In the implementation shown, the metal fill layer 230 is formed over the metal gate layer 228. The metal fill layer 230 can include metals of lower resistivity than the metal gate layers 224 and 228. Thus, the metal fill layer 230 can be used to provide low resistance contact to memory cell and logic transistors to be formed in the substrate regions 204. Examples of metals for the metal fill layer 230 include aluminum and copper. The metal fill layer 230 can be formed by depositing a layer of metal over the metal gate layer 228.

Referring now to FIG. 1 and FIG. 2G, the process 100 includes forming, from the second metal gate layer (e.g., 228), a second metal gate (e.g., 228b) of a second memory cell transistor (e.g., 234b), the second metal gate of a second work function (e.g., $f_2$), the second memory cell transistor having a second threshold voltage (e.g., $Vt_2$) (182). In FIG. 2G, a structure 282 corresponds to an exemplary implementation after forming, from the metal gate layer 228, a metal gate 228b of a memory cell transistor 234b. The metal gate 228b is of a work function $f_2$ and the memory cell transistor 234b has a threshold voltage $Vt_2$.

The present implementation includes optionally forming, from the metal gate layer 228, a metal gate 228d of a logic transistor 234d. The metal gate 228d is of the work function $f_2$ and the logic transistor 234d has a threshold voltage $Vt_4$. The memory cell transistor 234b is of a first conductivity type and the logic transistor 234d is of a second conductivity type. Thus, the metal gates 228b and 228d can both be formed from the metal gate layer 228 while the logic transistor 234d has the threshold voltage $Vt_4$, which is different than the threshold voltage $Vt_2$ of the memory cell transistor 234b.

The metal gates 228b and 228d can be formed from the metal gate layer 228 by performing a CMP or another type of planarization on the structure 280 in FIG. 2F. As an example, the metal gates 228b and 228d can be approximately 10 nm to approximately 30 nm thick. Additional processing can be performed to provide the memory cell transistors 234a and 234b and the logic transistors 234c and 234d (also referred to collectively as "transistors 234") in FIG. 2G. This may include formation of contacts for the transistors 234.

The memory cell transistor 234a includes the metal gate 224a of the work function $f_1$ and having the threshold voltage $V_{t1}$. The memory cell transistor 234a also optionally includes an overlying gate segment 228a (including gate metal) formed from the metal gate layer 228 and situated over the metal gate 224a. As an example, the overlying gate segment 228a can be approximately 10 nm to approximately 30 nm thick. Additionally, the memory cell transistor 234a optionally includes a metal fill 230a formed from the metal fill layer 230.

The memory cell transistor 234b includes the metal gate 228b of the work function $f_2$ and having the threshold voltage $V_{t2}$. The memory cell transistor 234b also optionally includes a metal fill 230b formed from the metal fill layer 230. By utilizing the metal gates 224a and 228b having different work functions $f_1$ and $f_2$, the memory cell transistors 234a and 234b can be efficiently fabricated while having different threshold voltages $V_{t1}$ and $V_{t2}$. In the present implementation, the metal gate layer 224 includes metal for a gate of an N type high-k metal gate transistor and the metal gate layer 228 includes metal for a gate of a P type high-k metal gate transistor. This results in the threshold voltage $V_{t2}$ being greater than the threshold voltage $V_{t1}$.

The logic transistor 234c includes the metal gate 224b of the work function $f_1$ and having the threshold voltage $V_{t3}$. The logic transistor 234c also optionally includes an overlying gate segment 228c (including gate metal) formed from the metal gate layer 228 and situated over the metal gate 224b. As an example, the overlying gate segment 228c can be approximately 10 nm to approximately 30 nm thick. Additionally, the logic transistor 234c optionally includes a metal fill 230c formed from the metal fill layer 230.

The logic transistor 234d includes the metal gate 228d of the work function $f_2$ and having the threshold voltage $V_{t4}$. the logic transistor 234d also optionally includes a metal fill 230d formed from the metal fill layer 230. By utilizing the metal gates 224b and 228d having different work functions $f_1$ and $f_2$, the logic transistors 234c and 234d can be efficiently fabricated while having different threshold voltages $V_{t3}$ and $V_{t4}$. As described above, the metal gate layer 224 includes metal for a gate of an N type high-k metal gate transistor and the metal gate layer 228 includes metal for a gate of a P type high-k metal gate transistor. This results in the threshold voltage $V_{t4}$ being greater than the threshold voltage $V_{t3}$.

The memory cell transistors 234a and 234b also respectively include the dielectric segments 210a and 210b, which are gate dielectrics, and in the present implementation, high-k gate dielectrics. Similarly, the logic transistors 234c and 234d respectively include the dielectric segments 210c and 210d, which are gate dielectrics, and in the present implementation, high-k gate dielectrics. As noted previously, the dielectric segments 210 can be formed from a same dielectric layer so as to be substantially similar in thickness and composition.

In the implementation shown, the memory cell transistors 234a and 234b are of a first conductivity type and the logic transistors 234c and 234d are of a second conductivity type. As an example, the memory cell transistors 234a and 234b are N type memory cell transistors respectively including a channel region 235a and a channel region 235b that are P type and the source/drain regions 220 that are N type. The logic transistors 234c and 234d are P type logic transistors respectively including a channel region 235c and a channel region 235d that are N type and the source/drain regions 220 that are P type. However, in some implementations, the memory cell transistors 234a and 234b are P type transistors and the logic transistors 234c and 234d are N type transistors. As such, in accordance with some implementations, four different one of the transistors 234 can be fabricated utilizing only two metal gate layers 224 and 228, with each of the transistors 234 having different threshold voltages $V_{t1}$, $V_{t2}$, $V_{t3}$, and $V_{t4}$. While FIGS. 2A, 2B, 2C, 2B, 2E, 2F, and 2G demonstrate formation of four different transistors 234, any combination and number of the transistors 234 may be fabricated in various implementations. For example, in some implementations, only the memory cell transistors 234a and 234h and the logic transistor 234d are fabricated.

Figure 3:
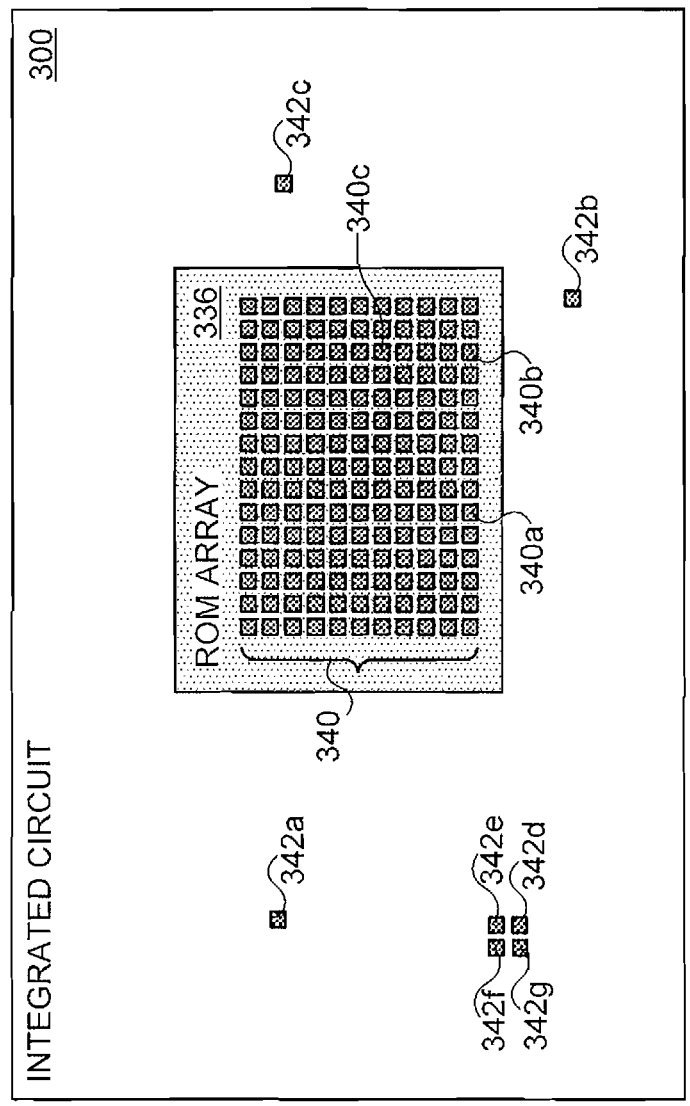
FIG. 3 illustrates a top view of an exemplary IC including a ROM array.

FIG. 3 illustrates a top view of an exemplary IC including a ROM array. More particularly, FIG. 3 illustrates an IC 300 including a ROM array 336. The ROM array 336 includes memory cell transistors 340, of which memory cell transistors 340a, 340b, and 340c are individually labeled. The IC 300 also includes logic transistors, of which logic transistors 342a, 342b, 342d, 342e, 342f, and 342g are shown.

The IC 300 can be fabricated by utilizing the process 100, described above. In various implementations, the transistors 234 of FIG. 2G can correspond to any of the memory cell transistors 340 and the logic transistors 342a, 342b, 342d, 342e, 342f, and 342g, or other transistors not specifically shown. However, in the present implementation, the memory cell transistors 234a and 234b in FIG. 2G correspond to any combination of the memory cell transistors 340.

As the memory cell transistors 234a and 234b have different threshold voltages $V_{t1}$ and $V_{t2}$, the memory cell transistors 234a and 234b can correspond to different logical states in the ROM array 336. More particularly, some of the memory cell transistors 340 are substantially similar to the memory cell transistor 234a so as to have the threshold voltage $V_{t1}$ corresponding to a first logical state. Others of the memory cell transistors 340 are substantially similar to the memory cell transistor 234b so as to have the threshold voltage $V_{t1}$ corresponding to a second logical state.

The IC 300 is configured to sense the first and second logical states based on the threshold voltages $V_{t1}$ and $V_{t2}$. In some implementations, the threshold voltages $V_{t1}$ and $V_{t2}$ differ by at least approximately 100 mV. In some implementations, the threshold voltages $V_{t1}$ and $V_{t2}$ differ by approximately 200 mV to approximately 400 mV.

Thus, in accordance with some implementations, the ROM array 336 can be programmed utilizing the memory cell transistors 234a and 234b including the metal gates 224a and 228b with different work functions $f_1$ and $f_2$. In doing so, among other advantages, the ROM array 336 can have highly secure programming that is difficult to reverse engineer. More particularly, physical differences between the memory cell transistors 234a and 234b may not be readily apparent. Thus, it can be difficult to reverse engineer programming of the ROM array 336 utilizing visual inspection or other non-invasive means.

Additionally, in some implementations, the ROM array 336 can easily and inexpensively be fabricated with different programming by altering the mask 226, which is a low grade mask. For example, the memory cell transistor 234a and the memory cell transistor 234b can have the source/drain regions 220 and the channel regions 235a and 235b be functionally interchangeable (e.g. due to being formed using the same implant and anneal). Similarly, the dielectric segments 210, serving as gate dielectrics, can be functionally interchangeable (e.g. due to being fabricated from the same dielectric layer). Thus, the memory cell transistor 234a in FIG. 2G can be made to have the threshold voltage $V_{t2}$ simply by changing the mask 226 so that the overlying gate segment 228a forms a metal gate of the memory cell transistor 234a. Similarly, the memory cell transistor 234b in FIG. 2G can be made to have the threshold voltage $V_{t1}$ simply by changing the mask 226 so that the overlying gate segment 228c forms a metal gate of the memory cell transistor 234a.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. An integrated circuit (IC) comprising:
a first memory cell transistor of a read only memory (ROM) array, said first memory cell transistor comprising a first metal gate including a first metal segment of a first work function, said first memory cell transistor having a first threshold voltage;
a second memory cell transistor of said ROM array, said second memory cell transistor comprising a second metal gate including a second metal segment of a second work function, said second memory cell transistor having a second threshold voltage, wherein the second threshold voltage is greater than the first threshold voltage;
a first logic transistor, said first logic transistor having a third metal gate including a third metal segment of said first work function, said first logic transistor having a third threshold voltage; and
an overlying gate segment is situated over the first metal gate of the first memory cell transistor and the third metal gate of the first logic transistor.

2. The IC of claim 1, wherein said first memory cell transistor and said second memory cell transistor are of a first conductivity type.

3. The IC of claim 1, wherein said first memory cell transistor includes a first high-k gate dielectric and said second memory cell transistor includes a second high-k gate dielectric.

4. The IC of claim 1, wherein said overlying gate segment is of a metal of said second work function.

5. The IC of claim 1, wherein said first memory cell transistor is of a first conductivity type and said first logic transistor is of a second conductivity type.

6. The IC of claim 1, further comprising:
a second logic transistor, said second logic transistor having a fourth metal gate including a fourth metal segment of said second work function, said second logic transistor having a fourth threshold voltage.

7. A method for fabricating an integrated circuit (IC), said method comprising:
forming, from a first metal gate layer, a first metal gate of a first memory cell transistor of a read only memory (ROM) array, said first metal gate including a first metal segment of a first work function, said first memory cell transistor having a first threshold voltage;
forming, from a second metal gate layer, a second metal gate of a second memory cell transistor of said ROM array, said second metal gate including a second metal segment of a second work function, said second memory cell transistor having a second threshold voltage, wherein the second threshold voltage is greater than the first threshold voltage;
forming, from said first metal gate layer, a third metal gate of a first logic transistor, said third metal gate including a third metal segment of said first work function, said first logic transistor having a third threshold voltage; and
forming an overlying gate segment over the first metal gate of the first memory cell transistor, and forming an overlying gate segment over the third metal gate of the first logic transistor.

8. The method of claim 7, wherein said first memory cell transistor and said second memory cell transistor are of a first conductivity type.

9. The method of claim 7, further comprising:
forming a metal fill layer over said second metal gate layer.

10. The method of claim 7, wherein said first memory cell transistor is of a first conductivity type and said first logic transistor is of a second conductivity type.

11. The method of claim 7, further comprising:
forming, from said second metal gate layer, a fourth metal gate of a second logic transistor, said fourth metal gate including a fourth metal segment of said second work function, said second logic transistor having a fourth threshold voltage.

12. The method of claim 7, further comprising:
utilizing a same implant to form source/drain regions of said first and second memory cell transistors.

13. The method of claim 7, wherein said first memory cell transistor includes a first high-k gate dielectric and said second memory cell transistor includes a second high-k gate dielectric.

14. A method for fabricating an integrated circuit (IC), said method comprising:
forming, from a first metal gate layer, a first metal gate of a first N type memory cell transistor of a read only memory (ROM) array, said first metal gate including a first metal segment of a first work function, said first N type memory cell transistor having a first threshold voltage;
forming, from a second metal gate layer, a second metal gate of a second N type memory cell transistor of said ROM array, said second metal gate including a second metal segment of a second work function, said second N type memory cell transistor having a second threshold voltage, wherein the second threshold voltage is greater than the first threshold voltage;
forming, from said first metal gate layer, a third metal gate of a first P type logic transistor, said third metal gate including a third metal segment of said first work function, said first P type logic transistor having a third threshold voltage; and
forming an overlying gate segment over the first metal gate of the first N type memory cell transistor, and forming an overlying gate segment over the third metal gate of the first P type logic transistor.

15. The method of claim 14, further comprising:
forming, from said second metal gate layer, a fourth metal gate of a second P type logic transistor, said fourth metal gate including a fourth metal segment of said second work function, said second P type logic transistor having a fourth threshold voltage.

16. The method of claim 14, further comprising:
forming a metal fill layer over said second metal gate layer.

17. The IC of claim 1, wherein the third threshold voltage is different from the first threshold voltage.

18. The method of claim 9, further comprising:
forming a metal fill layer over the overlying gate segment, wherein a size of the metal fill layer in the first memory cell transistor is smaller than a size of the metal fill layer in the second memory cell transistor.

19. The IC of claim 6, wherein the fourth threshold voltage is greater than the third threshold voltage.

20. The IC of claim 6, wherein the fourth threshold voltage is different from the first threshold voltage, the second threshold voltage, and the third threshold voltage.

21. The method of claim 11, wherein the fourth threshold voltage is greater than the third threshold voltage.

* * * * *